United States Patent [19]

Nunneley et al.

[11] Patent Number: 5,754,963

[45] Date of Patent: May 19, 1998

[54] METHOD AND APPARATUS FOR DIAGNOSING AND ISOLATING FAULTY SENSORS IN A REDUNDANT SENSOR SYSTEM

[75] Inventors: John Nunneley; Hayato Sugawara, both of Novi, Mich.

[73] Assignee: Hitachi America, Ltd., Tarrytown, N.Y.

[21] Appl. No.: 688,306

[22] Filed: Jul. 30, 1996

[51] Int. Cl.⁶ .................................................. G06F 11/00
[52] U.S. Cl. ...................... 701/34; 701/63; 701/76; 701/92; 340/438; 324/537; 324/555
[58] Field of Search ...................... 701/29, 34, 35, 701/63, 76, 92, 107; 340/438, 650, 651, 653, 428, 514, 517; 324/537, 555, 556, 677–679

[56] References Cited

U.S. PATENT DOCUMENTS

| | | | |
|---|---|---|---|
| 3,594,788 | 7/1971 | Seelig | 340/517 |
| 4,001,676 | 1/1977 | Hile et al. | 324/678 |
| 4,408,155 | 10/1983 | McBride | 324/51 |
| 4,408,289 | 10/1983 | Boning et al. | 701/34 |
| 4,583,176 | 4/1986 | Yamato et al. | 364/431.11 |
| 4,845,435 | 7/1989 | Bohan | 324/537 |
| 4,920,939 | 5/1990 | Gale | 123/399 |
| 4,922,425 | 5/1990 | Mack et al. | 364/424.1 |
| 4,979,117 | 12/1990 | Hattori et al. | 364/431.07 |
| 5,008,823 | 4/1991 | Takahashi | 701/34 |
| 5,017,910 | 5/1991 | Farber et al. | 340/635 |
| 5,095,453 | 3/1992 | Pierson et al. | 364/571.01 |
| 5,250,909 | 10/1993 | Bitts | 324/542 |
| 5,359,290 | 10/1994 | Cervas | 324/384 |
| 5,375,056 | 12/1994 | Nitschke et al. | 701/34 |
| 5,394,093 | 2/1995 | Cervas | 324/556 |
| 5,394,341 | 2/1995 | Kepner | 364/551.01 |
| 5,617,337 | 4/1997 | Eidler et al. | 701/34 |

*Primary Examiner*—Gary Chin
*Attorney, Agent, or Firm*—John J. Sideris

[57] ABSTRACT

A sensor failure and detection apparatus and method for use in a redundant sensor system are disclosed. A control circuit disconnects reference power supplied to a sensor and then monitors the voltage decay output by the sensor. The monitored rate of voltage decay of the sensor is compared to the expected natural voltage decay of the sensor to detect failures caused by short or open circuits. An error counter keeps track of the number of failures. After a threshold number of times in which the monitored voltage decay does not compare to a predicted rate of decay, power to the sensor is removed and the sensor is isolated from the system.

12 Claims, 3 Drawing Sheets

METHOD AND APPARATUS FOR DIAGNOSING AND ISOLATING FAULTY SENSORS IN A REDUNDANT SENSOR SYSTEM

FIELD OF THE INVENTION

The present invention relates generally to redundant sensors in feedback applications, and in particular to an apparatus and method for testing, diagnosing and isolating, faulty sensors in safety critical applications.

BACKGROUND OF THE INVENTION

Electronic monitoring of the position of mechanical parts through the use of feedback sensors or sending devices is well known in the prior art. Also well known in the art is the use of redundant sensors in applications where sensor failure could result in direct injury or fatality, such as in automotive or aerospace applications. In recent years, the introduction of electronic controls and feedback in automotive applications to replace mechanically controlled parts with electronically controlled ones has brought greater focus on redundant sensor systems that can reliably provide passenger safety even in the event of a critical sensor failure.

When two or more sensors are used to read a variable in a safety sensitive application, it is critical to detect if there is a problem with any of the sensors, and if so, to identify which of the sensors is faulty. Upon identifying the failure, it is also important to isolate the faulty sensor from the system without affecting the operation of the remaining sensors. Examples of the sensor failures includes shorts or open circuit conditions in cables and connectors used to couple the sensors to a control circuit or central processing unit.

One current method of sensing when two redundant sensor signal lines are shorted together is to use a reverse bias scheme on the sensors (see, e.g., U.S. Pat. No. 5,260,877). This is done by reversing the reference voltage and ground on the two sensors. If this is done and two redundant sensor signal lines are shorted together, the sensors will indicate different output values even though their output voltages are the same. This provides an indication to the control circuit that there is a problem with the sensors.

One problem with this method occurs if the sensors are shorted together when they are at their crossover point and their output voltages are the same. In this situation, there is no way to diagnose the problem until the sensors are moved from the crossover point. Another problem with the foregoing method is that a short typically disables both sensors and renders a two sensor system useless. If there are more than two sensors there is still at least one sensor available to operate, but it is difficult to determine which sensor(s) have failed, and this introduces a third problem. With more than two sensors, at least half of the sensors have the same bias and therefore shorts between them cannot be diagnosed. Another problem with this method is that a separate reference is needed for each sensor in the event that the reference end of the sensor has a short to ground.

A separate method used to diagnose redundant sensor signal shorts is to offset each sensor by a known voltage. In this method, when this offset is not present the system will detect that a short circuit is present. However, this method requires a separate reference supply for each sensor. Moreover, this approach may not detect partial impairment of the sensor which may result in erratic control system behavior. Finally, this method does not provide for the isolation of the defective sensors.

Thus what is needed is a system for diagnosing and isolating faulty sensors without affecting the remaining sensors in redundant sensor applications.

Accordingly, it is an object of the present invention to provide a redundant sensor system in which faulty sensors can be independently diagnosed and identified.

It is another object of the present invention to provide a redundant sensor system in which faulty sensors can be operationally isolated without affecting the operation of the non-faulty sensors remaining in the system.

It is still another object of the present invention to accomplish the above-stated objects by utilizing an apparatus and method which is simple in design and use, and economical to manufacture.

The foregoing objects and advantages of the invention are illustrative of those which can be achieved by the present invention and are not intended to be exhaustive or limiting of the possible advantages which can be realized. Thus, these and other objects and advantages of the invention will be apparent from the description herein or can be learned from practicing the invention, both as embodied herein or as modified in view of any variations which may be apparent to those skilled in the art. Accordingly, the present invention resides in the novel methods, arrangements, combinations and improvements herein shown and described.

SUMMARY OF THE INVENTION

In accordance with these and other objects of the invention, a brief summary of the present invention is presented. Some simplifications and omissions may be made in the following summary, which is intended to highlight and introduce some aspects of the present invention, but not to limit its scope. Detailed descriptions of a preferred exemplary embodiment adequate to allow those of ordinary skill in the art to make and use the inventive concepts will follow in later sections.

According to a broad aspect of the invention, an apparatus for detecting and diagnosing faults in a single sensor or a plurality of sensors is disclosed. The sensor diagnostic apparatus includes a sensor coupled to a voltage source and having an output signal proportional to a variable monitored by the sensor. A switch coupled between the voltage source and the sensor provides a reference voltage to the sensor when the switch is in a closed position. A control circuit is coupled to the switch and to the sensor, for selectively turning the switch off to disconnect the reference voltage from the sensor, and for monitoring the rate of voltage decay at the output signal of the sensor. The control circuit compares the monitored rate of voltage decay to a preset rate of voltage decay to produce an error indication when the monitored rate of voltage decay does not match the preset rate of voltage decay.

A method of diagnosing a faulty sensor is also disclosed. The method is directed to a sensor coupled to a reference voltage through a switch, the switch being responsive to a control circuit. The control circuit is also coupled to the output signal of the sensor. The method includes the steps of (i) disconnecting the reference voltage to the sensor by turning the switch to an open position; (ii) monitoring the rate of voltage decay in the output signal of the sensor; (iii) comparing the monitored rate of voltage decay to an expected rate of voltage decay; and (iv) indicating a fault condition for the sensor when the monitored rate of voltage decay does not match the expected rate of voltage decay.

DETAILED DESCRIPTION OF THE PREFERRED EMBODIMENTS OF THE INVENTION

The present invention contemplates an improved sensor failure detection and isolation apparatus and method for redundant sensor systems, that uses the natural voltage decay of the signal voltage when power to the sensor reference is turned off. The voltage decay of the sensor signal is compared to a predicted rate of decay in order to detect a failure. Faulty sensors are electrically isolated from other sensors in the redundant sensor system.

Figure 1:
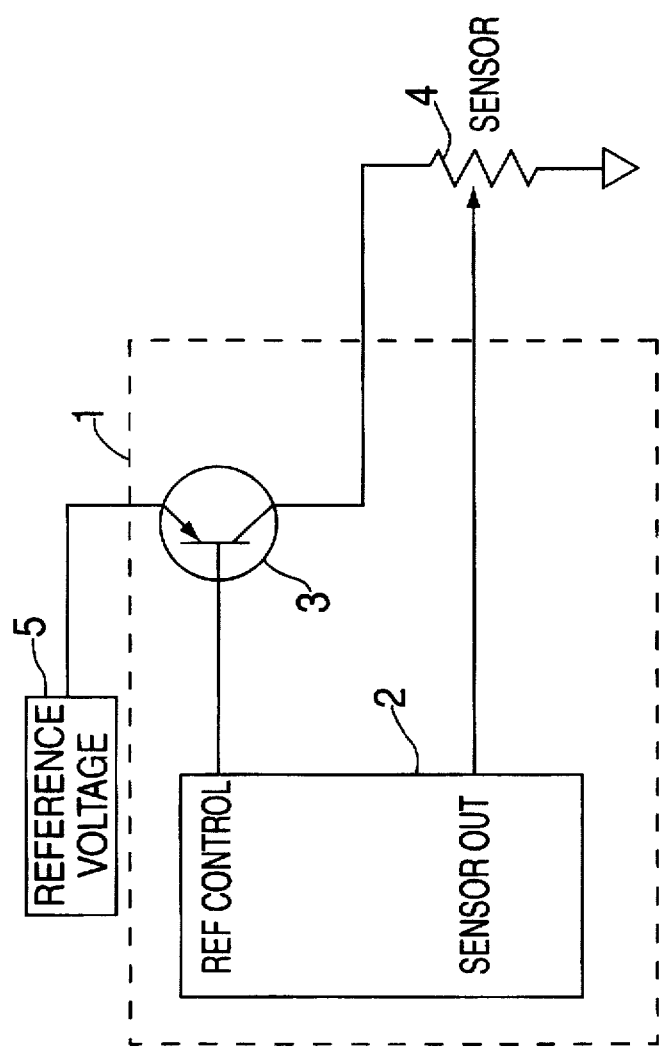
FIG. 1 is a schematic diagram of one sensor diagnostic device according to one embodiment of the present invention.

Referring now to the drawings, wherein like numerals refer to like elements, there is disclosed in FIG. 1 broad aspects of a preferred embodiment of the invention. It is to be understood that the references to use of the apparatus in an automotive electronic throttle control, related to but not forming part of the invention, are provided for illustrative purposes only. References to electronic throttle controls or accelerator position sensors are provided for ease in understanding how the present invention may be practiced in conjunction with known types of safety control applications.

In FIG. 1, sensor fault detection apparatus or device identified generally by reference numeral 1 in accordance with the present invention is shown. FIG. 1 discloses a general arrangement of a single sensor diagnostic system 1 in series between a reference power supply 5 of suitable voltage for example, 5 volts, and a single electronic sensor 4 connected to a common line or ground. The sensor 4 may be, for example, a commercially available plezioelectric device, an optical coupler, a hall effect sensor, etc., as may be appropriate for its environment and the variable it will be measuring. In its simplest form, the diagnostic system or device 1 further includes a control circuit or microprocessor 2 coupled to the output signal of the sensor 4, and to the base or gate of a transistor 3 for switching the transistor between an "on" conducting state and an "off" non-conducting, or open circuit state. Although a solid state device such as a transistor 3 is preferred in the present invention, any electronic switching device such as a triac, a relay or a solenoid, etc. can be used for switching between an on position and an off position to connect and disconnect reference voltage to the sensor 4.

It is anticipated that the control circuit 2 may include a storage buffer or be coupled to a separate counter (not shown) for recording the number of faults attributed to each individual sensor 4. The control circuit 2 contemplated by the present invention and the error counter may be implemented programmatically or by direct electrical connection through customized integrated circuits, or a combination of both, using any of the methods known in the industry for providing the functions described herein without departing from the teachings of the invention. Those skilled in the art will appreciate that from the disclosure of the invention provided herein, commercial semiconductor integrated circuit technology would suggest numerous alternatives for actual implementation of the functions of the control circuit 2 and the error counter that would still be within the scope of the invention. In one preferred embodiment of the invention, the functions of control circuit 2 are performed by microprocessor devices, as are commonly available in the industry.

With this circuit arrangement, the basic operation of the sensor 4 can be checked to detect any faults. Briefly, when the control circuit 2 switches the transistor 3 to an off state, and the natural voltage decay of the signal voltage when the power to the sensor 4 is disconnected is monitored and compared to expected values by control circuit 2. The specifics of the operation of the diagnostic device 1 will be described in detail below.

Figure 2:
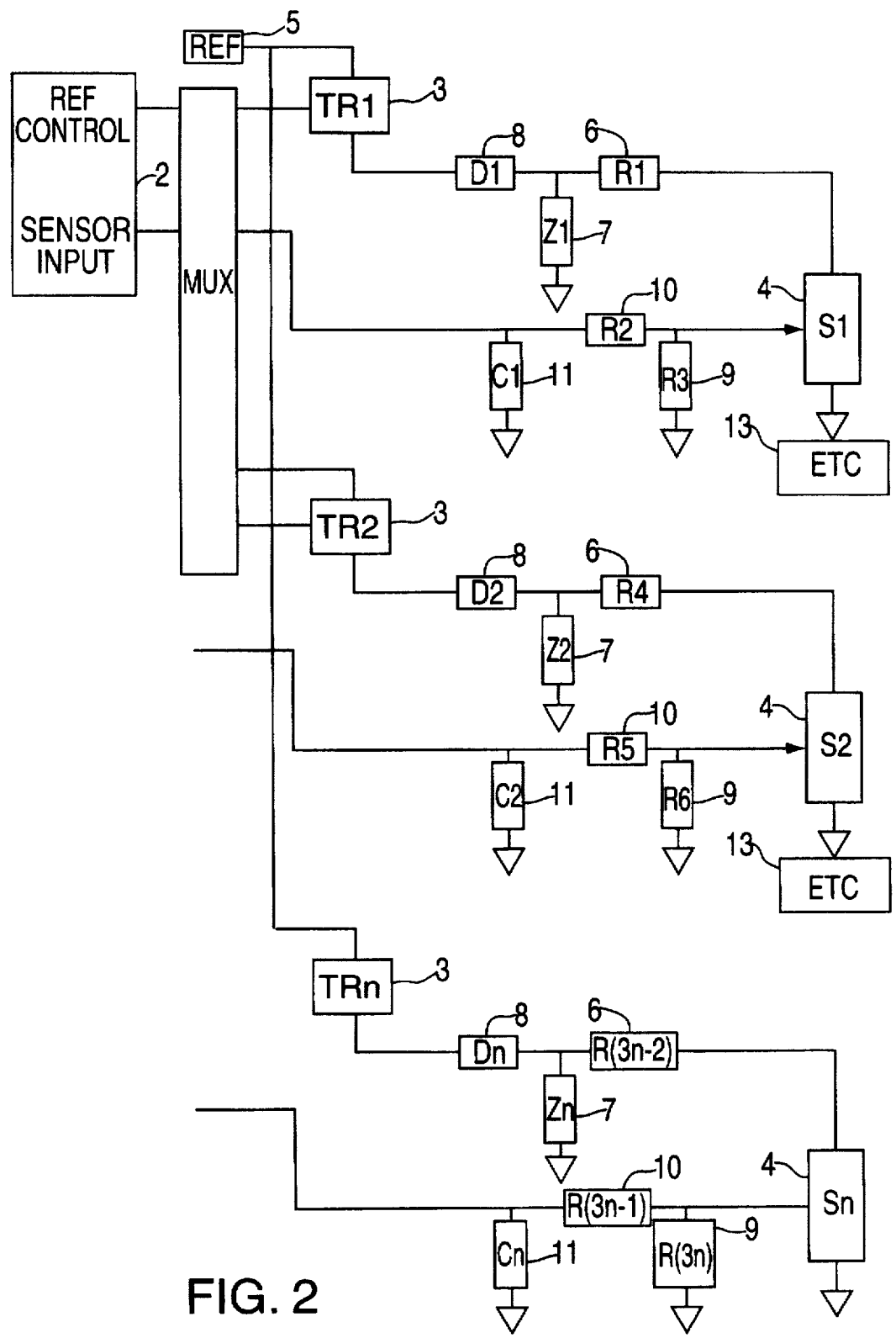
FIG. 2 is a block form diagram of a redundant sensor safety system containing at least one diagnostic device according to one embodiment of the present invention.

The structural characteristics of the diagnostic device 1 are best understood by referring to the operative arrangement of the invention illustrated in an electronic throttle control ("ETC") redundant sensor system in FIG. 2. In FIG. 2, a preferred embodiment of the invention is shown in an ETC system having a plurality of redundant diagnostic devices 1 in which the reference voltage 5 can be disconnected from each of the sensors 4 by switching off the corresponding transistors 3. Sets of redundant sensors 4 are positioned to monitor different variables of the ETC 13, such as, for example, the rotational position of the throttle valve. In series with each sensor 4 is resistor 6 and diode 8. Disposed between diode 8 and resistor 6 is a zener diode 7 bridge to ground. All three components are coupled to the emitter of transistor 3. The combination of resistor 6 and zener diode 7 are used to protect the transistor 3 from over voltage. Diode 8 is used to protect transistor 3 from reverse voltage.

Coupled between the sensor 4 output and the sensor input of the control circuit 2 is an R-C circuit made up of a resistor 10 and a capacitor 11. A pull-up resistor 9 is coupled between the sensor 4 output and ground in parallel to capacitor 11. Resistor 10 is connected in series between the resistor 9 and capacitor 11. This circuit arrangement is repeated with each of the sensors 4 in the redundant sensor system, as shown in FIG. 2. Depending on the number of diagnostic devices 1 in the safety system, a multiplexer 12 may optionally be coupled between the sensor 4 and transistor 3 of each diagnostic device 1 and the control circuit 2 for handling a plurality sensor signals in an orderly fashion.

In operation, during a diagnostic test of any sensor 4 in the redundant sensor arrangement shown, one sensor reference voltage 5 at a time is turned off by the control circuit 2. During the time that power to a sensor 4 is turned off and until power is restored, the sensor 4 is electrically isolated from the other sensors in the system. The control circuit 2 disconnects power to the sensor 4 by switching transistor 3 to an off state. Immediately after the sensor 4 is turned off, the voltage signal (sensed by the control circuit 2) begins to decay in accordance with the time constant formed by the electrical characteristics of resistor 9 in parallel with sensor 4 and resistor 10 and capacitor 11.

Figure 3:
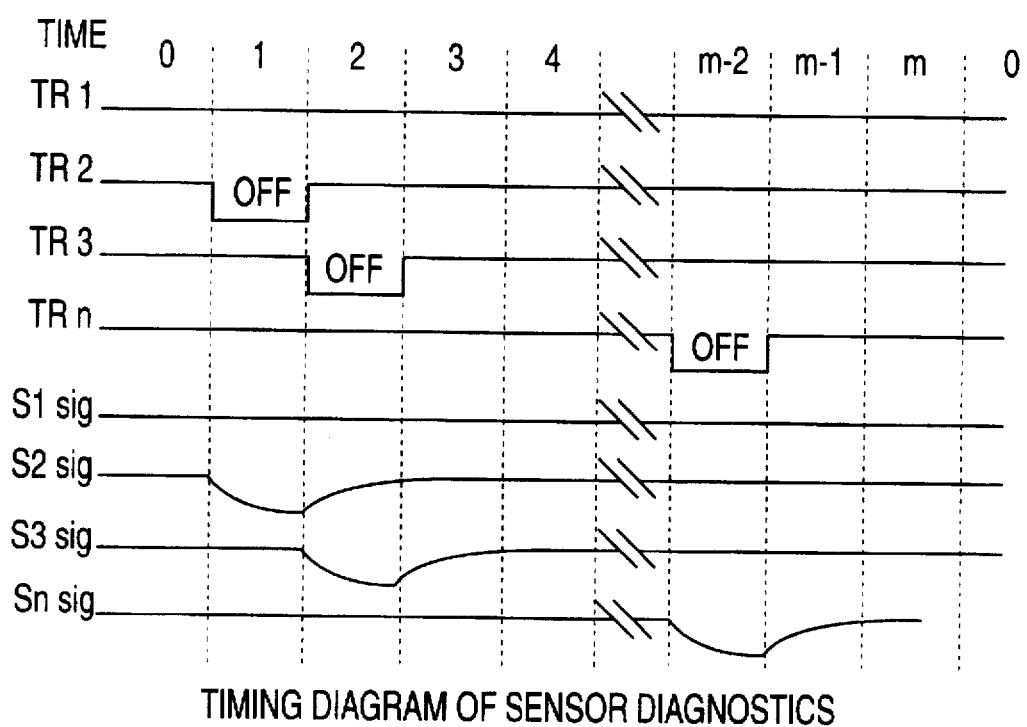
FIG. 3 is a timing diagram of the operation of redundant sensors according to one embodiment of the present invention.

The voltage level decay, if the sensor 4 is operating properly, will be at a known rate. For example, FIG. 3 shows a timing diagram of the separate voltage level decay of multiple sensors 4 as their reference voltages 5 are sequentially turned off and on. At time 0, all of the sensors 4 are connected to their respective reference voltages 5. At time 1, the transistor 3 labeled as "TR2" is switched to an off state. Correspondingly, the voltage level of the related sensor 4, labeled "S2", begins to decay in a non-linear fashion. The observed rate of decay is governed by the following equation:

$$V_{decay} = c^{(T_{off}/TC_{decay})} \times V_{initial}$$

In foregoing equation, $V_{decay}$ = the voltage level after a period of decay $T_{off}$ = the time that the reference voltage has been switched off $TC_{decay}$ = time constant of the voltage decay based on capacitor 11, resistors 9 and 10, and the internal resistance of sensor 4

$V_{initial}$ = voltage level before the reference voltage is turned off

After the reference voltage is off for a predetermined time period (as graphically represented in FIG. 3), the signal level is compared by the control circuit 2 to preset voltage levels or to the voltage level of a sensor output signal that was not disconnected from the reference voltage 5. If the signal is within a predetermined tolerance of an expected value to which it should have decayed, the sensor 4 is deemed to be operating properly. The control circuit 2 then restores power to the sensor 4 by switching on the TR2 transistor 3.

Conversely, if the rate of decay does not match the expected signal level, the sensor 4 is considered to have had a fault. Each time the voltage level is outside of the threshold of the predetermined range, at least one buffer or counter (not shown) in the control circuit 2 may be incremented to indicate that a fault in the sensor 4 occurred. Alternatively, the buffer can be used to indicate the number (or percentage) of instances when the sensor 4 has exhibited the proper rate of decay. The control circuit 2 discontinues power to the sensor 4 and electrically isolates it from the system if a threshold number of errors are logged to the sensor 4. As can be understood by those skilled in the art, to avoid the false diagnosis of a failure, the tolerance level of the expected signal must be set (by varying the RC time constant) to account for normal voltage fluctuations that the sensor 4 may undergo when operating properly. For example, the decay profile of a properly operating sensor 4 should not be set so that it may resemble the normal voltage drop that the sensor 4 may experience as it is measuring a changing variable of the ETC.

There are several modes of failure which can afflict a sensor 4 in a redundant sensor system. A short circuit may occur between the high voltage side of the sensor 4 and the low voltage (ground) side. In addition, a short circuit may occur between the signal line and either the high voltage side of the sensor 4 or the low voltage side of the sensor 4. Alternatively, a short circuit may occur between the signal lines of different sensors 4. An open circuit may occur among any of the lines of the circuit.

Advantageously, the present invention can diagnose any of the foregoing fault conditions. A short circuit between the high side of the sensor 4 and the low side of sensor 4 can be diagnosed simply by monitoring the sensor 4 output at the control circuit 2 and comparing it to the expected decay level. If the comparison fails, the faulty sensor 4 can be removed from the redundant sensor system by not returning power to the sensor 4 through transistor 3.

Similarly, a short circuit between the signal line and the high side of the sensor 4 or the low side can be diagnosed by comparing the sensor output to a profile of the voltage decay of a properly operating sensor 4. A short circuit between the signal lines of two sensors 4 can be diagnosed by monitoring the rate of decay of the output voltage of one of the suspected sensors 4. Any deviation from the anticipated signal will constitute a fault, and the failed sensor 4 can remain unpowered and isolated from the other sensors 4 of the system.

The present invention can also detect a fault if the signal line or reference line of one sensor 4 is shorted to the reference voltage side of another sensor 4. In such a case, after the power is removed from the sensor 4 being tested, its level will remain high, specifically that of the reference voltage 5 to which it is coupled or its current output voltage.

Accordingly, the voltage decay profile of the tested sensor 4 will not match the anticipated decay level, and a fault will be indicated. The defective sensor 4 can then be electrically isolated from the remainder of the system. Using the expected rate of voltage decay to indicate the proper operation of a sensor, the present invention can also be used to detect failed filter components resistor 10 and capacitor 11.

After power is restored to a sensor 4, the voltage level of the signal will rise (as seen in time 2 of sensor S2) in a non-linear manner until it stabilizes in accordance with the variable it is monitoring. An uncertain amount of error may be introduced to the sensor output signal as the power is restored, until the sensor 4 reaches a steady state condition. Because of the critical nature of an ETC operation, in the preferred embodiment of the invention, a sensor 4 is not utilized until a certain time period has lapsed, resulting in an acceptably low error rate of 1%, for example. The necessary time lapsed to reduce the error rate, is determined using the following formula:

$$\text{Error}=1-((1-exp(-t_{off}/tc_{decay}))\times(1-exp(-t_{on}/tc_{rise}))+exp(-t_{off}/tc_{decay}))$$

Where, $t_{off}$ = Time reference voltage is turned off $t_{on}$ = Time reference voltage is turned on $tc_{decay}$ = Time constant of sensor signal decay during the time reference voltage is off $tc_{rise}$ = Time constant of sensor signal rise during the time reference voltage is on Application of this formula is represented in FIG. 3. In the timing diagram shown, sensor S2 should not be used for variable monitoring purposes during time 1,2 and 3; sensor S3 should not be used during time periods 2, 3 and 4, etc. As can be appreciated by those skilled in the art, the ETC redundant sensor system should be configured such that at least two sensors 4 are in the steady state condition for accurate variable reading while other sensors 4 are within the higher than acceptable error range caused by cycling the reference power off and on.

Although the present invention has been described in detail with particular reference to preferred embodiments thereof, it should be understood that the invention is capable of other and different embodiments, and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only, and do not in any way limit the invention, which is defined only by the claims.

We claim:

1. A sensor diagnostic apparatus for detecting faults, said sensor diagnostic apparatus coupled to a voltage source and comprising:

a sensor means coupled to the voltage source and having an output signal proportional to a variable monitored by said sensor means;

a switching means having an off position and an on position, said switching means coupled between the voltage source and said sensor for providing a reference voltage to said sensor when said switching means is in an on position; and a control means coupled to said switching means and to said sensor means for selectively turning said switching means to an off state to disconnect the reference voltage from said sensor means, and for monitoring the rate of voltage decay at the output signal of said sensor means and comparing the monitored rate of voltage decay to a preset rate of voltage decay to produce an error indication when the monitored rate of voltage decay does not match the preset rate of voltage decay.

2. A sensor diagnostic apparatus according to claim 1 wherein said switching means is a solid state transistor having its base coupled to said control means.

3. A sensor diagnostic apparatus according to claim 1 further comprising a counter coupled to said control means for recording the number of instances when the monitored rate of voltage decay does not match the preset rate of voltage decay.

4. A sensor diagnostic apparatus according to claim 1 wherein said control means further comprises at least one buffer for recording the number of instances when the monitored rate of voltage decay either matches or does not match the preset rate of voltage decay.

5. A sensor diagnostic apparatus according to claim 1 further comprising a plurality of sensor means and a plurality of switching means, wherein each of said sensor means is coupled to one of said switching means such that said reference voltage is provided to each of said sensor means through a separately controlled switching means.

6. A sensor diagnostic apparatus according to claim 1 further comprising a multiplexer coupled between the plurality of said sensor means and said switching means, and said control means for multiplexing the operation of said plurality of switching means and the output signals of said plurality of sensor means, with said control means.

7. A sensor diagnostic apparatus according to claim 1 wherein said control means is a microprocessor.

8. A method of diagnosing a faulty sensor, said sensor having an output signal and being coupled to a reference voltage through a switch, said switch being responsive to a control circuit, said control circuit further coupled to the output signal of said sensor, wherein said method comprises the steps of:

disconnecting the reference voltage to said sensor by turning said switch to an open position;

monitoring the rate of voltage decay in the output signal of said sensor;

comparing the monitored rate of voltage decay to an expected rate of voltage decay; and indicating a fault condition for said sensor when the monitored rate of voltage decay does not match the expected rate of voltage decay.

9. A method of diagnosing a faulty sensor, according to claim 8, further comprising the step of recording in a counter each instance in which a fault is indicated for the sensor.

10. A method of diagnosing a faulty sensor, according to claim 9, further comprising the step of restoring power to said sensor by turning said switch to a closed position if the number or percentage of faults attributed to said sensor is below a threshold value.

11. A method of diagnosing faulty sensors, according to claim 8, further comprising the step of multiplexing both the control of a plurality of switches and the monitoring of the output signals of a plurality of sensors, to said control circuit so that said sensors are diagnosed at different times.

12. A method of diagnosing faulty sensors, according to claim 11, wherein at least two of said sensors are not being diagnosed and are at a steady state condition at all times.

* * * * *